(12) United States Patent
Oclee-Brown et al.

(10) Patent No.: US 11,626,098 B2
(45) Date of Patent: Apr. 11, 2023

(54) ACOUSTIC WAVEGUIDES

(71) Applicant: GP Acoustics International Limited, New Territories (HK)

(72) Inventors: Jack Anthony Oclee-Brown, Staplehurst (GB); Mark Alexander Dodd, Woodbridge (GB)

(73) Assignee: GP ACOUSTICS INTERNATIONAL LIMITED, New Territories (HK)

( * ) Notice: Subject to any disclaimer, the term of this patent is extended or adjusted under 35 U.S.C. 154(b) by 378 days.

(21) Appl. No.: 17/065,125

(22) Filed: Oct. 7, 2020

(65) Prior Publication Data
US 2021/0110808 A1    Apr. 15, 2021

(30) Foreign Application Priority Data
Oct. 9, 2019   (GB) ..................................... 1914596

(51) Int. Cl.
  *G10K 11/18*    (2006.01)
  *G10K 11/02*    (2006.01)
  *H04R 1/30*     (2006.01)
  *G10K 11/32*    (2006.01)

(52) U.S. Cl.
  CPC .................................. *G10K 11/32* (2013.01)

(58) Field of Classification Search
  CPC ...... G10K 11/22; G10K 11/02; G10K 11/025; G10K 11/32; G10K 11/26; G10K 11/30; G10K 11/18; H04R 1/30; H04R 1/345; H04R 1/34; H04R 1/20; H04R 1/28; H04R 1/2803; H04R 2201/34; H04R 2400/13
  See application file for complete search history.

(56) References Cited

U.S. PATENT DOCUMENTS

| | | | |
|---|---|---|---|
| 1,314,980 A * | 9/1919 | Pogonowski .......... | G10K 13/00 181/192 |
| 1,992,268 A | 2/1935 | Wente | |
| 2,848,058 A * | 8/1958 | Hartsfield .............. | H04R 1/345 181/176 |
| 3,303,904 A * | 2/1967 | Kelly .................... | H04R 1/345 181/187 |
| 3,467,218 A * | 9/1969 | Masahiro ............... | H04R 1/345 181/175 |

(Continued)

FOREIGN PATENT DOCUMENTS

| | | |
|---|---|---|
| CN | 105244019 A | 1/2016 |
| CN | 206302548 U | 4/2017 |

(Continued)

OTHER PUBLICATIONS

Search Report issued for GB1914596.0 dated Mar. 5, 2020.

*Primary Examiner* — Edgardo San Martin
(74) *Attorney, Agent, or Firm* — Westman, Champlin & Koehler, P.A.; Z. Peter Sawicki; Amanda M. Prose

(57) ABSTRACT

A method of designing an acoustic waveguide in which acoustic waves travelling along the waveguide are treated as exhibiting single parameter behaviour, and in which the waveguide provides a boundary confining the acoustic waves as they travel along the wave propagation path and has two substantially parallel, primary surfaces spaced apart a distance less than a wavelength of a high frequency acoustic wave. The primary surfaces may be planar, curved, or a combination of planar portions and curved portions.

15 Claims, 10 Drawing Sheets

(56) References Cited

U.S. PATENT DOCUMENTS

| | | | | |
|---|---|---|---|---|
| 3,957,134 | A | * | 5/1976 | Daniel .................. G10K 11/30 |
| | | | | 181/176 |
| 3,972,385 | A | * | 8/1976 | Hino ..................... H04R 1/345 |
| | | | | 181/159 |
| 4,308,932 | A | | 1/1982 | Keele |
| 5,163,167 | A | | 11/1992 | Heil |
| 6,581,719 | B2 | * | 6/2003 | Adamson ............... G10K 11/26 |
| | | | | 181/182 |
| 7,278,513 | B2 | * | 10/2007 | Brawley, Jr. ........... H04R 1/345 |
| | | | | 181/187 |
| 8,761,425 | B2 | * | 6/2014 | Donarski ................ H04R 1/00 |
| | | | | 381/338 |
| 9,245,513 | B1 | * | 1/2016 | Dimitrov ............... G10K 11/26 |
| 9,392,358 | B2 | | 7/2016 | DeLay et al. |
| 9,571,923 | B2 | * | 2/2017 | Spillmann ............ H04R 1/2803 |
| 10,382,860 | B2 | * | 8/2019 | Spillmann ............. H04R 1/345 |
| 2008/0059132 | A1 | | 3/2008 | Zander et al. |

FOREIGN PATENT DOCUMENTS

| | | | | |
|---|---|---|---|---|
| DE | 10061734 A1 | * | 8/2002 | ............. H04R 1/34 |
| FR | 2890481 A1 | | 3/2007 | |
| GB | 2588142 A | * | 4/2021 | ............ G06F 30/20 |
| KR | 102027706 B1 | | 10/2019 | |

* cited by examiner

ACOUSTIC WAVEGUIDES

CROSS REFERENCE TO RELATED APPLICATION

This application claims priority to and benefits of GB Patent Application No. 1914596.0, filed Oct. 9, 2019, the content of which is hereby incorporated by reference in its entirety.

FIELD OF THE INVENTION

The present invention relates to methods for designing waveguide apparatus, and to waveguides produced using such methods, particularly but not exclusively waveguides for acoustic waves.

BACKGROUND ART

For the purposes of this invention, the term waveguides should be construed as encompassing any apparatus which acts to convey or to emit acoustic waves; this includes apparatus which conveys acoustic waves along a path, often non-linear, and loudspeakers, horns and the like which in general direct acoustic waves along the length of the loudspeaker to an outlet aperture where the acoustic waves are emitted into ambient air for a listener to hear. The present invention is intended particularly but not exclusively to convey/emit the sound reproduced by an artificial source such as an electromechanical driver with very little spatial spectral distortion, giving a sound spectrum very similar to the original source of the sound over a defined area—that is, to produce "high fidelity" artificial sound, or sound of a quality very close to the real sound.

Typically the range of human hearing is considered to be between 20 Hz and 20 kHz, and the terms low frequency ("LF") and high frequency ("HF") used herein should be interpreted as being at one end of this sound spectrum—such that an apparatus which deals with high frequencies with high fidelity has poor low frequency fidelity, and vice versa. At ground level, a 20 Hz acoustic wave has a wavelength of approximately 17 m, and a 20 kHz acoustic wave has a wavelength of approximately 17 mm.

There are many different designs of waveguides and loudspeakers. Controlling the directional characteristics of loudspeakers is necessary to obtain good sound quality throughout an audience area and controlling the magnitude of reflections from the walls of a room. For larger rooms horns may be used both to achieve sufficient acoustic level and control the spatial dispersion of the sound.

One common view of an ideal sound source is a point source radiating acoustic waves in all directions; the acoustic waves produced in such an arrangement would be spherical, and would have no pressure variation according to the frequency or to the angle or direction from the source pressure: such waves we refer to as single parameter waves. In addition to spherical acoustic waves produced by a point source, cylindrical acoustic waves produced by a linear source are theoretical examples of single parameter waves. Both of these waves have particle velocity radiating in straight lines from the source so may be 'guided' without changing their behaviour by straight walled tubes radiating from the source. The simplest form of these 'waveguides' are a cone or straight sided pyramid to guide spherical waves and a prism shaped waveguide to guide cylindrical waves.

A less well-known wave type is produced by horns with geometry constructed by rotating the section of a conical flare around an axial point behind the apex. Such horns produce toroidal waves where the toroid is a surface of revolution formed about a circular revolved figure. Toroidal waves are not single parameter waves but they can be quite closely approximate due to their symmetry. Toroidal waves have very little variation of wavefront shape with frequency and they can very closely approach a toroidal shape, but the pressure increases near the axis of revolution. Due to the limited angles of arc used in such horns this pressure variation is of little practical consequence and many practical devices produce toroidal waves.

Horns with curved walls do not allow single parameter propagation. For low frequencies, where the wavelength is much larger than the horn section dimensions, say 10 times, the behaviour is determined by the boundaries. At these low frequencies the wavefronts must be perpendicular to the horn walls and have constant mean-curvature to give constant local flare across the wavefront. The constant flare of the wavefront allows the pressure to remain constant across successive wavefronts. In effect, at low frequencies, the wavefront behaves as if it is a single parameter wave. However, at high frequencies where the wavelength is small compared to the horn dimensions, the boundary only effects the wave within a wavelength of the boundary. Consequently, the fixed free space propagation speed results in diffraction giving the wave complex shape and pressure distribution.

The term flare may be applied to describe the area change of a wavefront or of any part or section of wavefront as the wave propagates. In this sense flare is the rate of change of area with distance propagated. This metric may also be applied to describe the area expansion of spherical waves and cylindrical waves in free space. In both cases the flare is highest near the source resulting in a reduction in low frequency radiation for small sources. The flare from a spherical source is higher due to the wave being curved in two dimensions whereas the cylindrical wave is curved only in the plane normal to the linear source leading to less flare.

It is also desirable to achieve high output at low frequencies to cover a wide bandwidth necessitating a high acoustic impedance at the horn entrance aperture at low frequencies. This requires an elongated horn with the corresponding curvilinear walls to limit the rate of expansion and hence flare of the wave. An exponential horn is one example of such a horn, but numerous variations exist with different flare laws. However, simple horns using these expansion laws do not allow single parameter wave propagation and have a response spectrum that varies with position. Discontinuities of the horn's flare such as at the outlet aperture of a finite horn may result in longitudinal reflection and the corresponding resonances. The wave at the horn mouth also diffracts imposing directivity characteristics determined largely by the mouth size.

Many conventional loudspeakers and waveguides are designed so as to produce spherical waves but these have variable results according to the wide variation in frequencies they are intended to deal with. One type of loudspeaker adopting a spherical wave theoretical approach and methodology to achieve wide dispersion is the multicell horn, such as is disclosed in U.S. Pat. No. 1,992,268. This design is formed from an array of exponentially flared horns arranged to provide an approximately spherical wave at the outlet aperture. Although this arrangement provides wide dispersion of HF sound there is some variation of response with angle due to imperfections in the wavefront shape and diffraction at the outlet aperture. However, at low frequencies the high acoustic impedance at the entrance gives good low frequency output.

A loudspeaker design adopting a toroidal wave theoretical approach and methodology is the bi-radial horn, which is formed from rotating curves with different axes and centres, as in U.S. Pat. No. 4,308,932. This design has a narrow slot which opens out equally along two different radii with two different centres of wavefront curvature, which opens out into a quasi-conical end section; the slot approximates a toroidal source. This design suffers from a discontinuity in area expansion at the slot since the conical section does not provide high acoustic impedance at low frequencies. This discontinuity results in standing waves within the horn leading up to the slot and an irregular acoustic impedance at the horn inlet; in general, this type of design can provide good acoustic directivity or low frequency output but not both. More recently a design using individual cells has been used to create a toroidal wave (the Polyhorn* by Turbosound Ltd ("Polyhorn is a registered UK trade mark now in the name of Blast Loudspeakers Ltd, of UK). Other designs which attempt to shape the acoustic waves they emit are disclosed in FR2890481, CN105244019 and U.S. Pat. No. 9,392,358, but these suffer from similar shortcomings as already described, and/or they are relatively complex designs which are difficult to manufacture inexpensively.

An alternative approach is to adopt the cylindrical wave theoretical approach and methodology. This may be achieved using a waveshaper to produce cylindrical waves terminated by a prismatic shaped horn to provide directivity control. The prismic flare expands mode slowly than a conical flare but has similar issues with the load resulting in a discontinuity at the end of the waveshaper. One such design is known as the VDOSC or V-DOSC loudspeaker (V-DOSC is a trademark of L'Acoustics SA of Asnières-sur-Seine, France) which converts spherical acoustic waves into approximately cylindrical waves. This is done by means of a conical section and a planar section which join at a corner running diagonally across the waveguide. The wave guide is fitted at the output of a loudspeaker, in front of the membrane or in front of the orifice of a compression chamber, along the axis of the transducer being considered, and comprising a conduit which expands from its inlet to its outlet. The area of the outlet orifice of the wave guide is planar and oblong, and its conduit comprises a passage between the inlet aperture and the output area, adapted to guide the waves along a general direction from which the shortest paths allowed in the one or more passages are all of lengths which are practically identical from the inlet aperture to the outlet aperture of the conduit. U.S. Pat. No. 5,16,3167 discloses a linear array V-DOSC arrangement in which a prismic horn with rectangular inlet aperture matching the rectangular outlet aperture of the VDOSC. This waveguide and horn arrangement can be used in linear arrays to form a large source of cylindrical waves. This design is intended to provide sound to large areas. It is found with these designs that the acoustic pressure varies across the outlet of the loudspeaker, standing waves are formed within the waveguide at certain frequencies, and the overall sound fidelity is disappointing, particularly at low frequencies.

Other designs which attempt to shape the acoustic waves they emit are disclosed in FR2890481, CN105244019 and U.S. Pat. No. 9,392,358, but these suffer from similar shortcomings as already described.

SUMMARY OF THE INVENTION

The following terms used herein have the following meanings:

waveguide inlet—either the orifice or aperture through which the wave enters into the waveguide, or an upstream (in the direction of wave propagation) portion of the waveguide.

wave guide outlet—the orifice or portion of the waveguide downstream of the waveguide inlet which provides a new wave shape to a horn, waveguide or free space wave guide primary surfaces or walls—closely spaced, opposed walls which are usually the largest walls. In the invention these walls are of a specific geometry to control the wavefront shapes and pressures. It should also be understood that these walls may be planar, but they do not have to be, they may be curved, or a combination of planar and curved; however, they are substantially parallel throughout (such that the distance between the walls, excepting the deformation, varies slowly along the path and remains substantially constant across the wavefront (i.e. less than 20% variation) or, in the case of an axisymmetric geometry, at a constant angle across the wavefront).

waveguide secondary boundary—formed by secondary walls or surfaces, symmetry planes or intersection between primary walls.

wavefront surface—a surface on which the phase of a sinusoidal sound pressure has a constant value.

single parameter wave—a wave with wavefront surface invariant with frequency and with constant pressure across the wavefront. The wave speed is constant.

flare—rate of change of area with distance. The flare may refer to any part of the wavefront.

deformation—a bump or corrugation added to the primary surfaces. The deformation is added in the same direction so the spacing between primary walls does not change.

conceptual waveguide—the virtual or theoretical starting geometry of a thin waveguide, which shape is then varied according to the invention so as to result in a final waveguide shape.

thin waveguide—a waveguide having two primary surfaces spaced apart a distance less than the wavelength of a high frequency acoustic wave.

design surface—an intermediate surface in between the primary walls/surfaces following the shape of the primary surface(s). These surfaces are used in the method of the invention to generate deformations in the waveguide shape and so construct a corrected waveguide.

wavefront length—the length of the curvilinear intersection between a wavefront surface and one of the waveguide primary surfaces.

wavefront elongation—increase in wavefront length due to deformations in the primary surfaces.

Waves which can be defined in terms of a single spatial coordinate have especially simple behaviour and are known as single parameter waves. Single parameter waves are known to provide frequency independent directivity. These waves all have a constant speed of propagation, and a constant 'rate of expansion with distance travelled' or 'flare' across each wavefront. A single parameter wave may also be carried by a waveguide formed as a tube with surfaces normal to the wavefront without resonance or diffraction. This makes single parameter waves ideal to either be carried in a waveguide or radiated to give constant directivity.

Conversely within a waveguide with curved boundaries waves do not behave in this simple way. Wavefronts only have a constant flare across them at very long wavelengths and, at such frequencies, the wave speed varies locally across the wavefront. For short wavelengths the boundaries only affect the wave closest to the boundary and wave speed determines the distance between wavefronts. The wavefront flattens and resonance may occur. Consequently, the wave will exhibit undesirable frequency dependant directivity and pressure.

The invention is based on the realisation that correcting the low frequency local wave speed deviation by adjusting the path length locally can allow a wave with approximately single parameter properties to propagate. The method involves starting from a conceptual waveguide shape and correcting it as will now be described.

To do this the waveguide must be thin enough to allow the wave to follow the waveguide round bends or corners. Above frequencies where the thickness is ¼ wavelength response irregularities occur, however, in practice for audio use in large auditoriums some irregularity may be tolerated and the waveguide is preferably thinner than the wavelength of the shortest wavelength waves propagated therein (i.e. for an acoustic waveguide, less than 17 mm).

The conceptual waveguide requiring correction is formed by two closely-spaced primary surfaces and two secondary boundaries. Wave-like behaviour is not apparent in the direction normal to the primary surfaces due to their close spacing. However, the secondary boundaries are spaced wider than a wavelength allowing wavelike behaviour, such as cavity resonance and diffraction, to occur tangential to the primary surfaces.

The wave enters the waveguide through an inlet aperture and leaves through an outlet aperture. The shapes of the inlet and outlet apertures match the geometry of the desired single parameter input and output waves respectively. For example, the apertures may be planar, cylindrical or spherical. Even when a single parameter input wave is provided matching the aperture geometry the pressure and wavefront shape within the waveguide will be frequency dependent in the working bandwidth.

We can for example consider deforming both primary surfaces of the conceptual waveguide locally by a vector approximately normal to the surfaces to form a 'bump' or 'ridge' while the thickness is approximately maintained. The deformation extends the path of the wave allowing path length to be corrected locally within the waveguide. A number of such deformations are used to extend the path in selected positions to create the final waveguide.

For long wavelengths the wavefront shape is determined by the secondary boundaries and the wave speed can be seen to vary due to the uneven wavefront spacing. Adding primary surface deformations to locations where the low frequency wave speed is low is used to locally increase the wave speed allowing it to be made equal throughout the waveguide. This allows high frequency waves to propagate with the same wavefront shape as low frequency waves and to also have constant pressure across the wavefronts. In effect, the waveguide supports single parameter waves but with wavefront shape or profile that may change as the wave propagates through the waveguide.

Due to the nature of waves the effect of boundary conditions is spatially averaged over a quarter of a wavelength of the upper frequency limit. Similarly, the geometry may have deviations from the ideal but if these are small the wave may still behave simply. In particular at the peak of the deformations there is no distance added so this region should be kept small compared to a wavelength at the upper frequency limit.

Correcting the distance the wave travels along by using deformations creates some elongation across the wavefront and a corresponding increase in area. For example, the length of the wavefront along the primary surfaces will increase in the region of deformed primary walls/surfaces. An adjustment to the local distance between primary walls in the region of the deformation may be used to correct local area changes due to the wavefront elongation.

The present invention provides both a method of designing a waveguide and new designs of waveguides. So there is provided in a first aspect a method of designing a waveguide for conveying acoustic waves along a wave propagation path through the waveguide from a waveguide inlet to a waveguide outlet, the waveguide providing a boundary confining the acoustic waves as they travel along the wave propagation path and being configured to restrict the size of the waves in one dimension to a distance less than a wavelength of a high frequency acoustic wave, the method comprising the steps of:

(1) defining the shape of the boundary at the waveguide inlet and at the waveguide outlet, and defining the distance between and the relative orientation of the waveguide inlet and the waveguide outlet according to a predetermined flare and waveguide input impedance;

(2) defining a conceptual waveguide shape to join the waveguide inlet to the waveguide outlet such that any variation in boundary shape and/or in direction of the waveguide propagation path are progressive along the waveguide propagation path;

(3) deriving from the conceptual shape of the waveguide a theoretical design surface extending along the waveguide propagation path and dividing the waveguide in a direction parallel to the said one dimension;

(4) defining a series of three or more spaced points along a wave propagation path through the waveguide;

(5) deriving homogeneous wavefront surfaces and their shapes within the waveguide at each of the series of points;

(6) deforming the shape of the design surface between each successive pair of spaced points normal to the design surface by a distance such that the propagation distance between the derived wavefront surfaces at the two spaced points is substantially constant;

(7) adjusting the conceptual waveguide shape in a direction parallel to the said one dimension by offsetting the deformed design surface by the said distance less than a wavelength (i.e. the distance between the primary surfaces) at the spaced points, and (8) calculating the flare of the derived wavefront surfaces at each of the spaced points and adjusting the local boundary dimension in a direction parallel to the said one dimension such that the flare for successive derived wavefront surfaces is appropriate for a predetermined acoustic load, and either (i) the flare of the derived wavefront surfaces is constant across the whole of the derived wavefront surface, or (ii) the flare varies smoothly and gradually across the derived wavefront surface.

A significant benefit of the approach of this invention is that wavefront curvature, tangential to the primary surfaces, determines directivity whereas the flare also depends on the spacing between primary surfaces. Consequently, the spacing between the primary surfaces may be used to adjust wavefront area and flare independently of wavefront curvature and hence dispersion. For example, the method allows approximately single parameter waves of appropriate curvature to be produced at the output aperture with area expanding exponentially between inlet and outlet aperture giving the low frequency output of an exponential horn and beneficial properties of single parameter waves. So, despite the waveguide having curved secondary boundaries, the wave throughout the invention waveguide behaves in a simple way.

The shape of the boundary at the waveguide inlet and at the waveguide outlet is preferably defined by reference to the desired wave shape. For a waveguide having primary surfaces to restrict expansion of the waves in the said one dimension and secondary surfaces to restrict expansion of the waves in a second dimension, the method may comprise deriving the shapes of the homogeneous wavefront surfaces at each of the series of points by assuming that each wavefront has a constant flare, and that each wavefront is perpendicular where it contacts the primary and secondary surfaces as the wavefront travels along the propagation path. The configuration of the waveguide is such that in most embodiments the primary surfaces are separated by a distance less than the wavelength of a high frequency acoustic wave.

The wave may be provided by a compression driver via a suitable waveguide to provide the required wavefront at the inlet aperture or in the case of numerical models a vibrating surface at the inlet aperture which is moving with a constant velocity normal to its surface.

Although many formulations may be used to calculate suitable deformations a simple method based on wave shape is especially effective since it allows a constant path length between wavefronts to be maintained whilst minimising wavefront elongation.

The rate of extension of the propagation distance due to the deformations is determined by the deformation slope in the direction of propagation. Regions where the deformation changes direction have varying slope so cannot correct the propagation speed of the wave exactly along the whole path. However, by ensuring the path length increase spatially averaged along the path over ¼ wavelength distance is correct, the waveguide will function as intended.

A more general approach than the approach defined above is possible. Deformations defined by pattern other than wavefronts may be used to reduce the propagation speed variation and allow approximately single parameter waves. The pattern should be chosen to minimise wavefront elongation and allow sufficient variation of path length to correct for propagation speed variations within the waveguide. Wavefront elongation will be greatly increased if numerous deformations lie across the wavefronts. Such an approach may be suitable for optimisation without going through the example process but simply by adjusting the height of the deformations iteratively to find the best response.

In some cases it might not be desirable or possible to correct the flare such that it is constant across each wavefront. In this case the wave amplitude will normally reduce in regions where the flare is higher, and the waves will not be single parameter. However, provided the amplitude reduction is small (6 dB), improved behaviour is often observed due to the propagation speed correction of the deformations.

Where the primary surfaces intersect the waveguide will only have one secondary wall and a segment-type geometry results. This non-ideal case of the invention is useful where amplitude shading is required, or where circular arrays are being used.

The methods according to this invention may incorporate many other approaches or assumptions, such as that the shape of the boundary at the initial point is significantly different from the shape of the boundary at the subsequent point (the solution is more difficult to calculate the more significant this difference). Others include: 1) that the wavefronts are cylindrical, spherical or toroidal or that the wavefronts have compound curvatures in two orthogonal directions; 2) assuming that the sound pressure level does not vary where the path is non-linear; 3) assuming that the distance between each successive pair of wavefronts is constant; 4) treating the waves as having wavefronts with different points on each wavefront having different individual paths along the nominal shape of the path with the nominal shape of the boundary being modified so as to vary the lengths of at least some of the individual paths adjacent to the boundary, and 5) carrying out the methods relating to the shape of the wavefronts, for an acoustic waveguide at a low acoustic frequency, preferably with a wavelength at least double or more preferably ten times the width of the waveguide between secondary walls. The easier method would be in the case where the wavefront surface area remains substantially constant, but in some applications this area would have to vary (at the cost of increased difficulty in the design process); for example, a waveguide in which there is no variation in area is commonly understood to be a "simple" waveguide, while an arrangement in which the area increases along the path is the case in a loudspeaker horn. It would be similarly easier where the shape of the boundary remains substantially constant, but again there are some applications where this shape will vary (examples of the latter are waveguides which convert acoustic waves from an annular source (toroidal waves) to a linear form (cylindrical waves), or from cylindrical to toroidal). In practice, the solutions where there is variation in area and/or shape may encompass the more useful waveguide designs—for example, the waveguide may be one which is intended to change the shape of wavefront: the wavefront may be planar at the initial point and be converted to spherical or cylindrical by a "horn-type" waveguide. Or, the waveguide could perform as a "VDOSC-type" arrangement, converting the wave shape progressively from a plane, annular shape to spherical and then to planar waves. Alternatively a waveguide such as a 'corner' type waveguide may simply change the orientation of a plane wave.

It is believed that the methods of this invention have not been used previously, and therefore the present invention also extends, in another aspect, to waveguides which have been designed using such methods. For example, the present invention provides a waveguide for conveying acoustic waves along a wave propagation path through the waveguide from a waveguide inlet to a waveguide outlet designed as described above, the waveguide providing a boundary confining the acoustic waves as they travel along the wave propagation path and having two substantially parallel, primary surfaces spaced apart a distance less than a wavelength of a high frequency acoustic wave.

The shape of the boundary may vary progressively along the path. The boundary may be offset in a direction perpendicular to the primary surfaces to form one or more localised deformations in the propagation path. The extent of the offset may vary in a direction parallel to the primary surfaces. The distance between the primary surfaces is preferably substantially constant, and is preferably less than the wavelength of the HF waves propagated along the waveguide (and for acoustic waveguides is preferably less than the wavelength of the highest frequency audible to a human listener, that is between 2 mm and 15 mm, preferably between 5 mm and 12 mm and more preferably about 7 mm). For applications where the frequency limit is lower the spacing may be increased accordingly. The primary surfaces can be substantially planar, curved, or a combination of curved and planar. The shape of the boundary at the inlet and outlet may be the same or different. The cross-sectional area of the boundary along a wavfront at the initial and subsequent points may be the same or different.

Waveguides in accordance with the invention have the benefits described above; they are also reversible in that it will also function as a wave-shaping waveguide if a wave is input at the outlet provided it matches the outlet aperture geometry.

An array of identical or dissimilar waveguides according to the invention may be used to form large wavefronts with a desired geometry. Two or more acoustic waveguides can be disposed adjacently so that the primary surfaces of a first waveguide form, on its reverse side, the primary surfaces of a second waveguide. The primary surfaces may be unitary with the secondary surfaces. A compound loudspeaker may comprise two or more waveguides with their paths located in series and/or in parallel: in series so that an acoustic wave from a first waveguide progresses directly into a second waveguide, in parallel to provide an array of waveguides as in a loudspeaker array.

The acoustic source for such waveguides is preferably a linear and/or curvilinear source extending transverse to the nominal planes of the primary surfaces.

BRIEF DESCRIPTION OF THE DRAWINGS

The invention will now be described by way of example and with reference to the accompanying figures, in which;

FIG. 4b shows the deformed design surface for the waveguide of FIG. 4a;

DETAILED DESCRIPTION OF THE EMBODIMENTS

Figure 1:
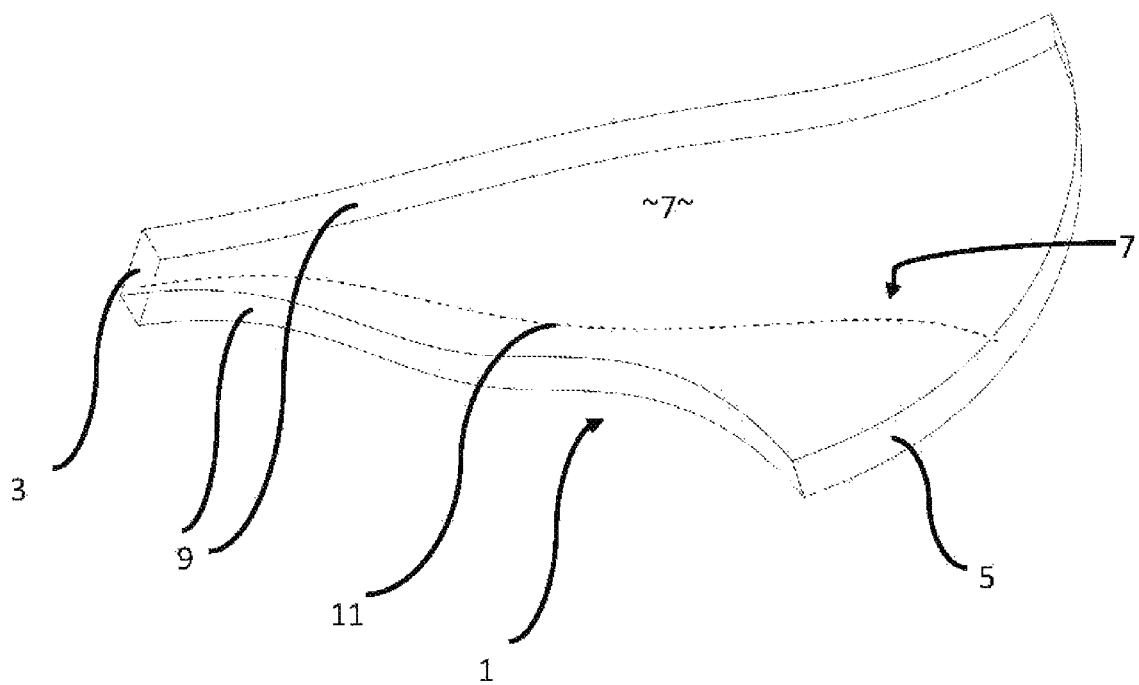
FIG. 1 is a schematic perspective view of a thin waveguide.

Where in what follows the same elements are shown in different drawings they have the same reference numerals; where an element is described which has a similar function but which is dissimilar in appearance to an element previously described, the latter element will have the same reference numeral but with the addition of a letter suffix. We will now describe, with reference to the drawings, the process of designing a waveguide in accordance with the invention—which may be set out in the following steps (which steps are further referred to below):

1. Define the wave shape and hence geometry for inlet and outlet apertures. At least one aperture for the waves must be more than a wavelength long in the primary direction and both apertures less than a wavelength in the secondary direction.
2. Define the distance and orientation between inlet and outlet aperture to allow the designed flare and hence waveguide input impedance.
3. Define a conceptual waveguide between input and output apertures and from this a 'design surface', usually midway between the primary surfaces of the conceptual waveguide, with inlet and outlet surfaces and sides bounded by the secondary surfaces or symmetry planes or intersection between primary surfaces.
4. Choose a series of at least 3 points along a path the wave may be expected to travel. The spacing between points is larger than spacing between primary walls and small enough to give deformed surfaces without excess wavefront elongation.
5. Derive homogeneous wavefront surfaces within the waveguide passing through the points chosen in 5 using a method such as the ones below:
    a) In the case of simple geometries the wavefront shape may be deduced from the boundary conditions. For example, assuming firstly constant flare of each wavefront and secondly that the wavefronts are perpendicular to the primary and secondary boundary surfaces.
    b) Calculate wavefront surfaces through the points at a frequency low enough for the wavelength to be preferably ten or a hundred times longer than the width of the waveguide.
    c) Solve Laplace's equation and finding homogeneous constant value surfaces of the solved parameter through the points.
    d) Use experimental methods to measure wavefronts.
6. Between each successive pair of derived wavefront surfaces add deformations normal to the design surface with height chosen such that the propagation distance between each pair of wavefronts is constant.
7. Create a waveguide according to the invention by offsetting the design surface by the thickness of the conceptual waveguide in corresponding positions.
8. Calculate wavefront flare and locally adjust the spacing between the primary surfaces such that:
    a) Except where amplitude shading at the output is appropriate the flare is constant across a whole wavefront.
    b) The flare for successive wavefronts through the waveguide is appropriate to give the desired acoustic load.
    c) Where amplitude shading at the output is appropriate, for example for non-parallel primary surfaces, the flare may vary smoothly and gradually across the wavefront.
9. The process from 7 may be repeated using a geometry derived with the method and derived wavefront surfaces for the deformed geometry allowing further adjustments to be made.

10. The height of corrugations, spacing between corrugations location of secondary boundaries at the top of the corrugation may be adjusted incrementally as part an iterative process to minimise variations in the transfer function at the outlet of the waveguide.

FIG. 1 is a schematic perspective view of a thin acoustic waveguide 1 consisting of rigid surfaces which join the inlet aperture 3 to the output aperture 5 and define a wave propagation path between the inlet and the outlet. In use, an acoustic wave enters the waveguide 1 through the inlet aperture 3 between the primary surfaces 7 and secondary boundary surfaces 9 passing along a path 11 to the output aperture 5.

Figure 2A:
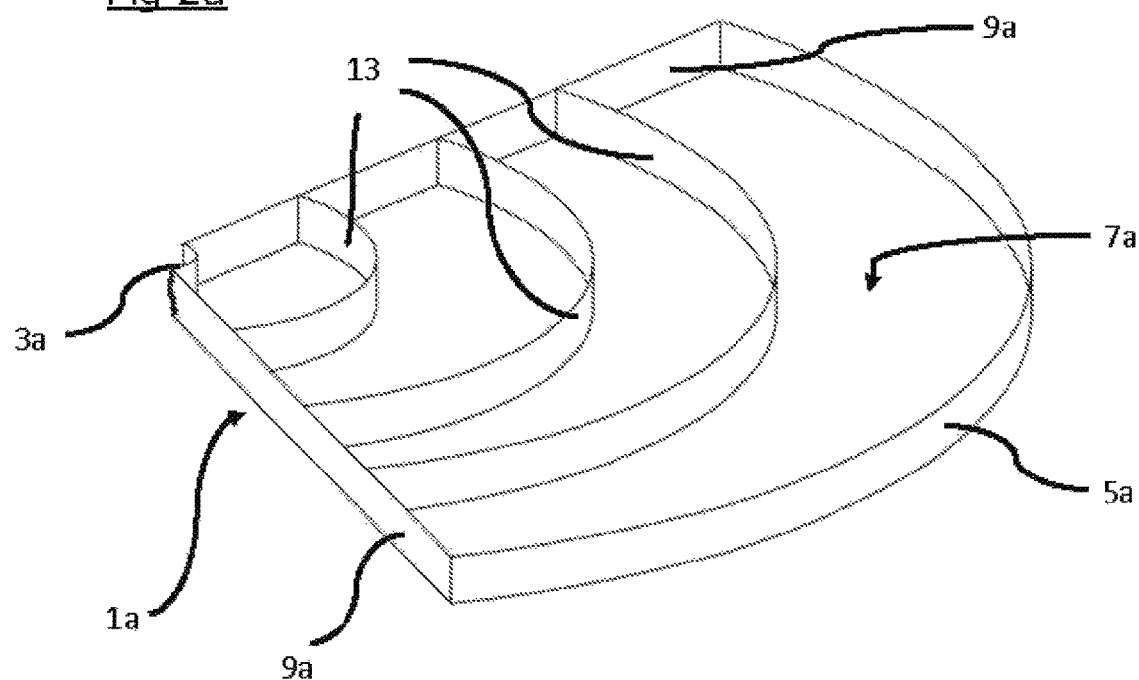
FIGS. 2a and 2b are schematic illustrations of a flat, planar waveguide or horn conveying cylindrical waves.
Figure 2B:
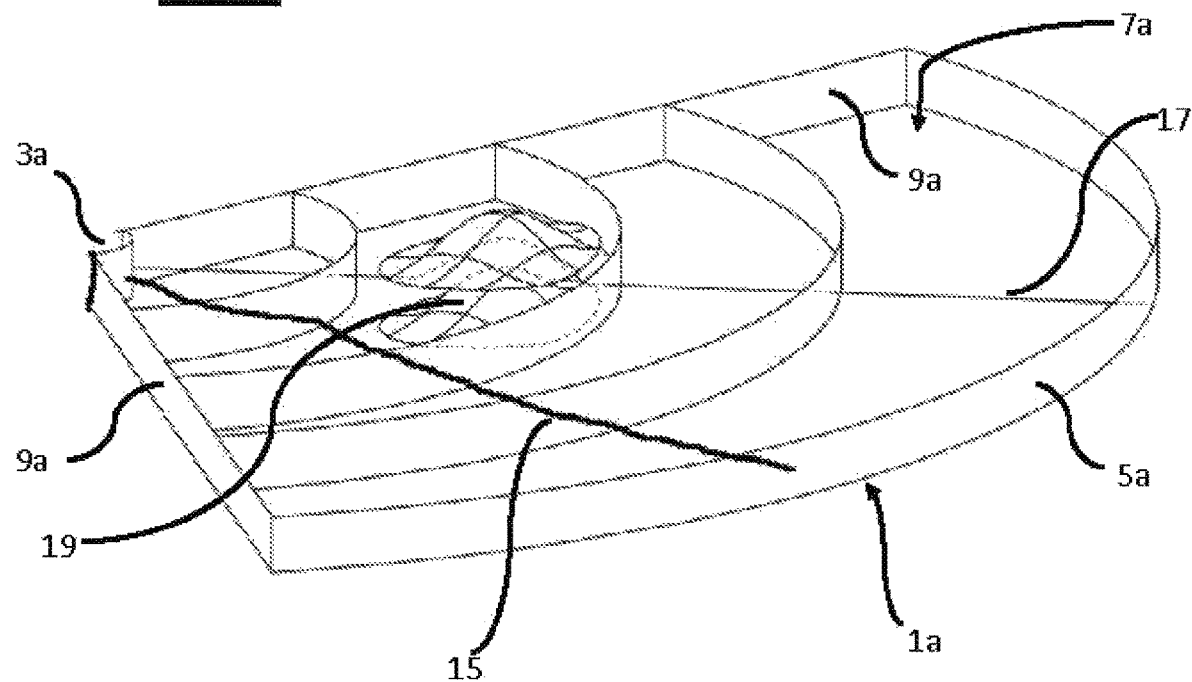

FIGS. 2(a) and 2(b) are schematic illustrations of a flat, cylindrical thin waveguide 1a, or prismatic horn, suitable for conveying cylindrical waves 13 (a few of these are shown schematically). A cylindrical wave enters the waveguide at entrance aperture 3a and is guided by primary surfaces 7a and secondary surfaces 9a to the output aperture 5a. In FIG. 2b the part of the wave travelling along the path 15 passes directly through the waveguide whereas the part of the wave travelling along path 17 passes over deformation 19 which increases the distance travelled by the wave.

Figure 3A:
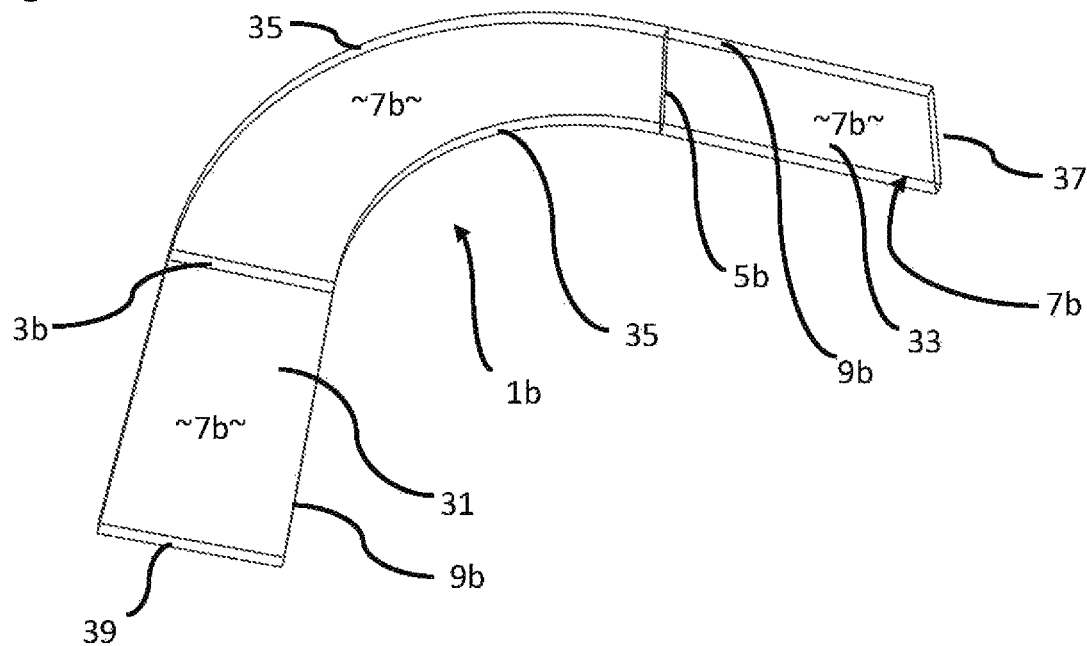
FIGS. 3a and 3b show a thin rectangular 'corner waveguide' 30 forming a 90 degree bend.

FIG. 3a shows a thin rectangular 'corner waveguide' 1b forming a circular 90 degree bend about an axis (not shown), and having an inlet 3b and an outlet 5b which are joined to straight input and output duct portions 31, 33. A source (not shown) provides plane waves to the input duct 31 which propagate through the corner waveguide to the output aperture 5b and into the output duct 33. The two ducts and corner waveguide have continuous primary walls 7b extending around the corner which are spaced 5 mm apart—less than a half wavelength of sound at 20 kHz, the maximum working frequency. The spacing between secondary walls 35 is 50 mm, significantly greater than the 20 kHz wavelength. The corner duct inner secondary wall 35 has a radius of 100 mm. The wave is assumed to exit the outlet aperture 37 of the outlet duct 33 as if there is a matching infinite duct extending it.

In the numerical simulations a vibrating surface at the inlet aperture 39 which is moving with a constant velocity normal to its surface produces plane waves and an infinite duct impedance condition is applied to the output aperture 37 of the output duct 33.

To evaluate the waveguide performance the pressure at three points is calculated: at the duct 1b output aperture 5b, one at both secondary walls 9b and one midway between them. At 3.4 kHz the wavelength is equal to the duct width; above this response irregularities of up to 20 dB magnitude occur and the waveguide cannot be used to transmit a high frequency signal.

Figure 3B:
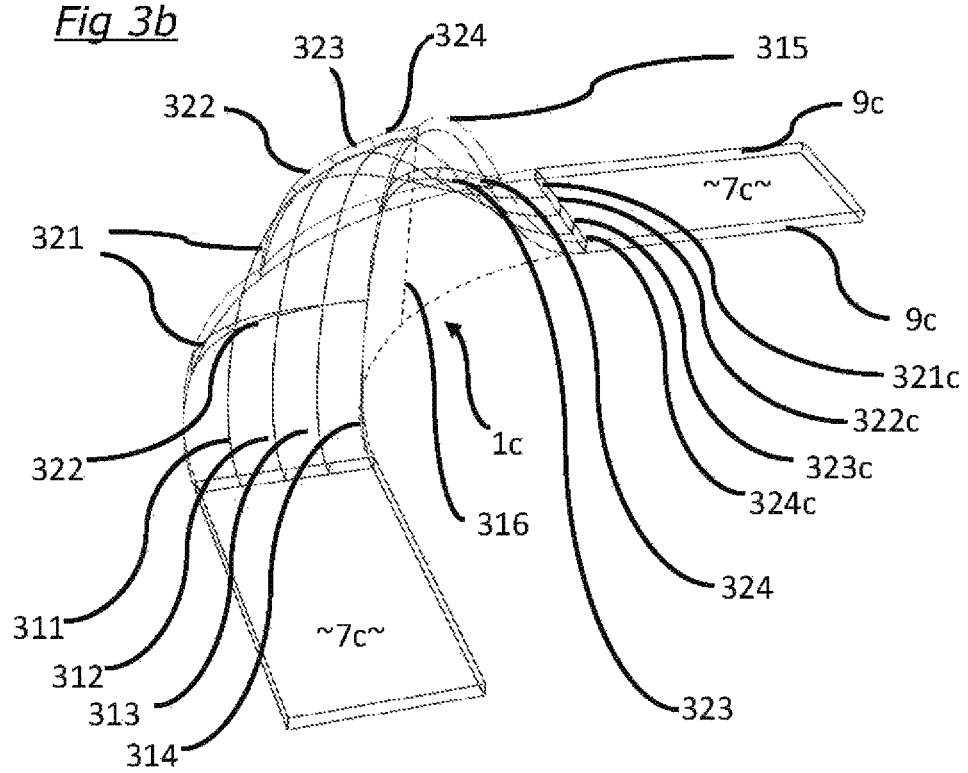

FIG. 3b shows the corner waveguide 1c where the path lengths 311, 312, 313 & 314 around the corner (one of which defines the inner edge of the corner, with the other three dividing the overall width equally) have been equalized by progressively elevating the waveguide create an undulation having a single "crest" 315 with a maximum height 316 halfway around the corner. Due to the steep radial inclination, the width of the duct 1c increases by 195% at the crest 315, leading to large wavefront elongation between the secondary surfaces 9c which are (continuous around the corner).

Paths of a wave may either be calculated or deduced. They are normal to the wavefronts and have a smooth curve. Where the primary surfaces are spaced by a constant distance the paths are equally spaced.

The illustrated waveguide has spacing between primary surfaces 7c which is adjusted to ensure that the cross-sectional areas 321, 322, 323 & 324 at each of the three points around the corner waveguide 1c are all equal to ¼ of the areas at the inlet and outlet apertures 321c, 322c, 323c & 324c (for clarity, only the areas at the outlet aperture are referenced on the drawing, but the areas at the inlet end are clearly shown and are equal in area to the referenced areas).

Numerical simulations show the area corrected waveguide of FIG. 3b has a low cut-off frequency of 2.3 kHz compared to 3.4 kHz of a non-area adjusted waveguide (not illustrated), possibly due to the increased width. Above the cut-off frequency the sound pressure response at the output aperture to becomes highly irregular with numerous response irregularities of tens of dB. Neither design of waveguide provides a significant improvement to the regularity of the output sound pressure response of the conceptual waveguide in FIG. 3a.

Figure 3C:
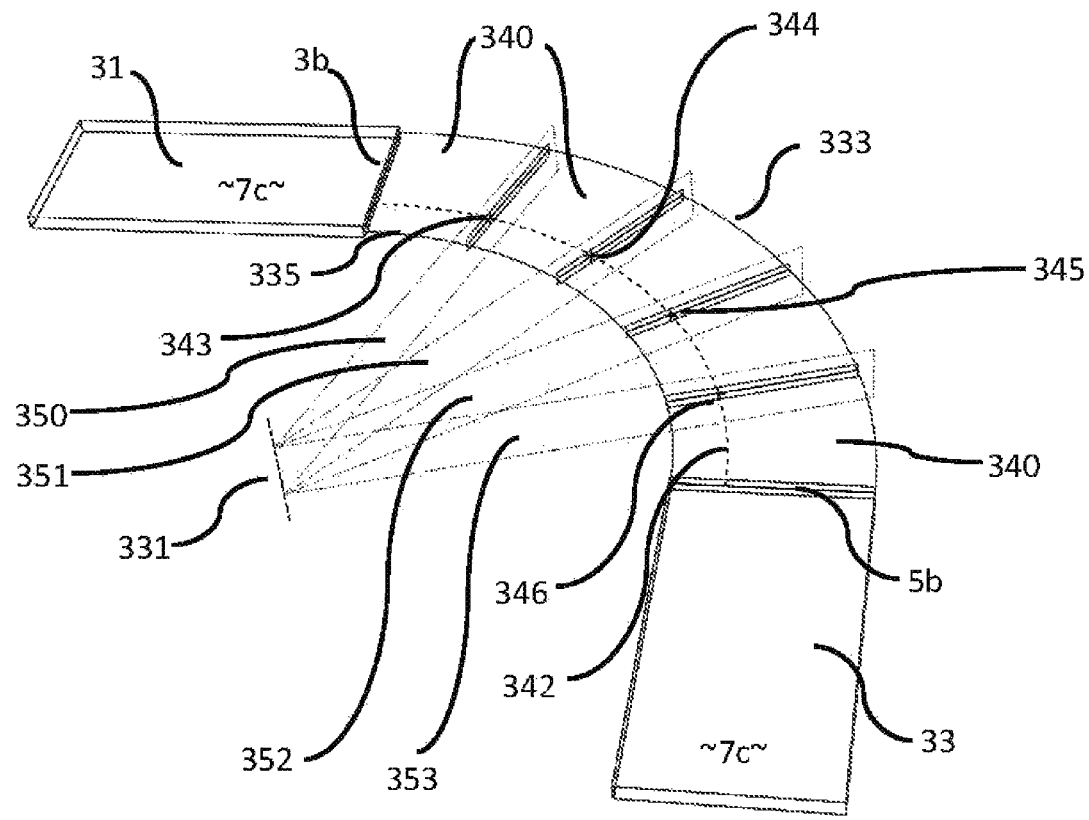
FIGS. 3c and 3d show steps in the design process of this invention starting from the corner waveguide of FIG. 3a, and FIG. 3e shows a waveguide in accordance with the invention.

FIG. 3c illustrates initial steps in the design process of the present invention using the waveguide design of FIG. 3a as the conceptual design shape.

Step 1 (as set out 3 pages above). The inlet 3b and outlet apertures 5b provide the surface of initial and final wavefronts passing through the waveguide 1b (note that for clarity FIG. 3c does not show the corner waveguide extending between the inlet and outlet ducts 31,33, the part-circular element shown is the design surface 340 (described further below)).

Step 2. The apertures 3b,5b are at 90 degrees about axis 331, and have a maximum circumferential distance apart defined by the length of the longer, outer edge 333, the minimum distance between the apertures being defined by inner edge 335.

Step 3. The design surface 340 lies midway between primary walls 7c and extends to the secondary walls 9b shown in FIG. 3a.

Step 4. A path 342, along which the wave may to be expected to travel, is defined between inlet and outlet apertures 3b, 5b on the design surface 340. As a possible approach it is decided that five corrugations or undulations will be required to reduce wavefront elongation; four points 343, 344, 345 & 346 on the path 342 are chosen, equally spaced around the axis 331.

Step 5a). The low frequency wavefronts have been deduced to lie on the planes 350, 351, 352 & 353 which passing through the axis of rotation 331 of the corner and the design surface 340. The remaining two wavefront surfaces (which together with the four points 343-346 will be used to define the five corrugations) lie on the intersections of the inlet and outlet apertures 3b, 5b and the design surface 340. It can be seen that the spacing between successive pairs of wavefronts is closer near the secondary wall at the inner edge 335 than the secondary wall at the outer edge 333, resulting in the wave speed being lower near the inside corner.

Figure 3D:
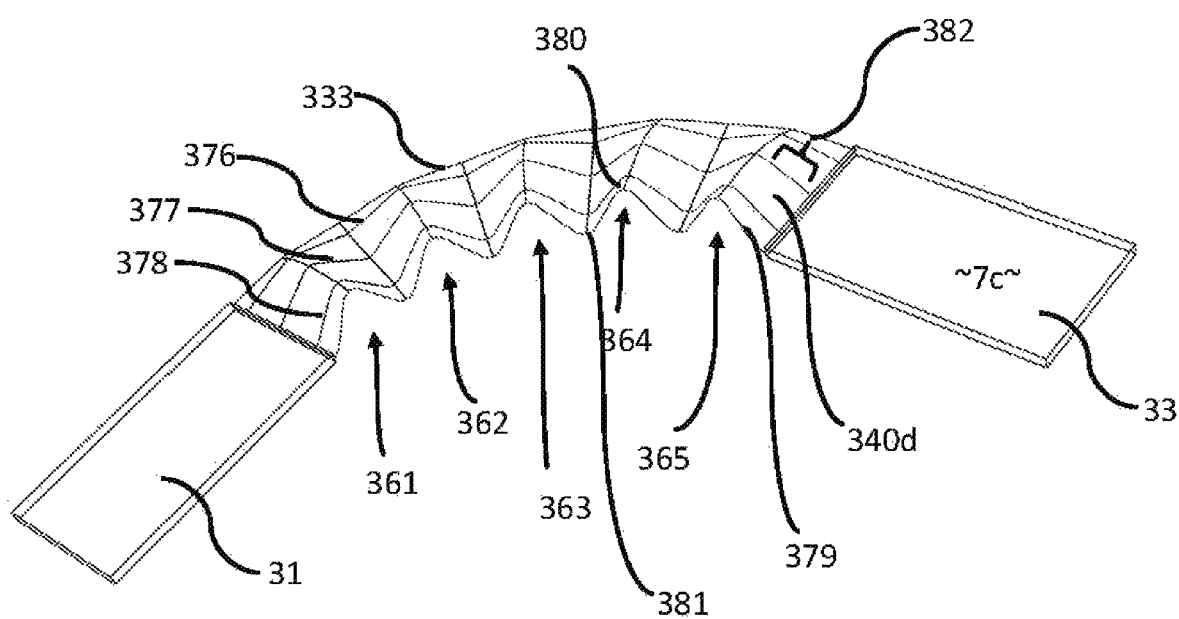

Step 6. FIG. 3d illustrates the deformed design surface 340d showing the five corrugations 361, 362, 363, 364, 365. The deformation of surface 340d is designed so as to give equal path lengths along the wave paths 333, 376, 377, 378, 379 and thus minimise wave speed differences.

In this example the paths are of the form of a 'saw tooth' section geometry with a radius at the crest 380 and trough 381 joined by an approximately flat surface 382 . This geometry may provide good correction for the linear part of the section since the slope may provide correct compensation over a greater distance so fewer corrugations are required compared to a section formed from radii.

As a consequence of the equally spaced wavefronts chosen the corrugations are identical simplifying construction. The wavefront elongation due to the difference between the length of the line defining the wavefront position and the line along the crest of the corrugation is less than 5% compared to the 95% distortion of FIG. 3*b*.

Figure 3E:
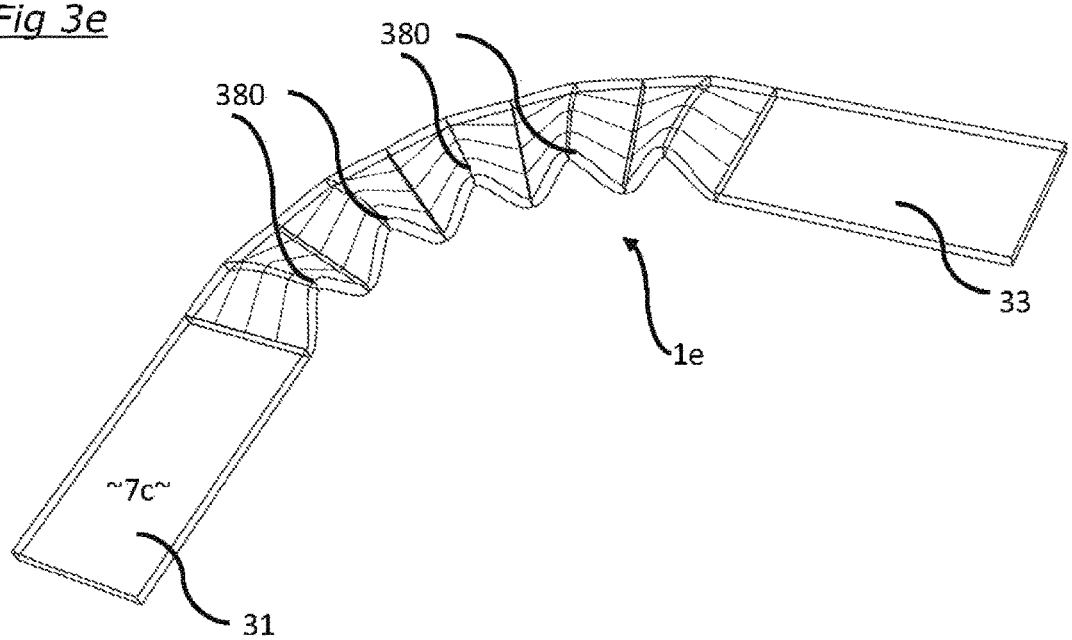

Step 6. FIG. 3*e* shows a corner 'wave-shaping waveguide' 1*e*, according to the invention, with primary surfaces 7*c* created by symmetrically offsetting the design surface 340 in FIG. 3*c* as shown in FIG. 3*d* to provide a duct having five corrugations. The wave-shaping corner waveguide is connected to input and output ducts 31, 33 with the same source and termination as in the previous example using the waveguide in FIG. 3*a* as the conceptual design.

Step 7, not illustrated

Using more undulations to increase path length gives much less wavefront elongation than might be expected due to the low height of the undulations necessary. The gradient determines the extent of the local increase of path length and the alternating gradient is defined in the light of the spatial averaging due to the behaviour of waves. Consequently local errors of path length will not affect the performance as long as they are smaller than ¼ wavelength of the maximum frequency.

The corner geometry at the corners at the crests 380 determines a frequency above which reflections and resonance occur. Preferably these corners only extend along the path for half a wavelength to avoid the impact of gradient errors.

For the waveguide in FIG. 3*e* the magnitude of the sound pressure response irregularities is of the order of a dB below 20 kHz since the thickness of 5 mm is less than ½ a wavelength.

Figure 4A:
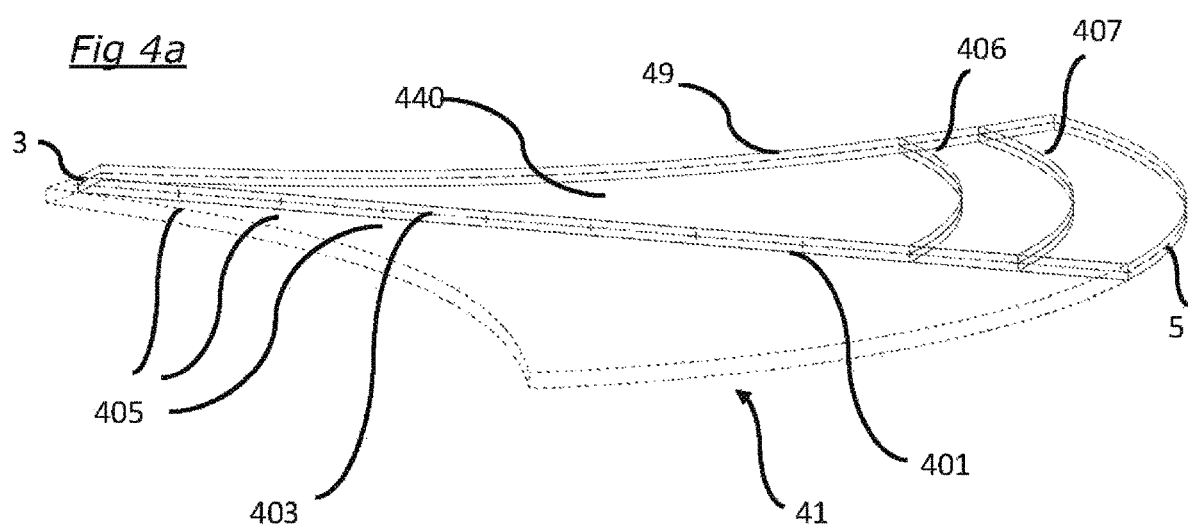
FIG. 4a is a prior art thin extruded waveguide.

FIG. 4*a* shows a prior art thin extruded waveguide 41 (The waveguide is symmetrical about plane 401 so only half a waveguide need be considered for modelling and analysis, and half of the waveguide is shown here only in phantom) with planar primary walls 5 mm apart, and secondary walls 49 formed from an exponential shaped curve. The waveguide is used as a conceptual waveguide for the example design process.

Step 1. A cylindrical wave 35.5 mm wide enters the inlet aperture 3, which is cylindrical with a circumferential width of 35.5 mm and an included angle of 18.5 degrees. The outlet aperture 5 is also cylindrical with a circumferential width of 375 mm and an included angle of 60 degrees.

Step 2. The distance between inlet and outlet aperture is chosen to be 362 mm which provides a high pass response with a −6 dB point at 220 Hz. Above 500 Hz the response near the symmetry plane will rise for increasing frequencies whereas the output near the secondary wall falls. In this case the variation is between these two positions is 15 dB at 10 kHz meaning that the sound quality is very poor in places.

Step 3 The waveguide consists of primary walls (not shown) and secondary boundaries of secondary wall 49 and symmetry plane 401.

Step 4. A path (dotted line 403) is chosen to be the intersection between the design surface 440 and symmetry plane 401. Nine points 405 equally spaced along the path are chosen to calculate wavefronts at those points.

Step 5b. Wavefronts are calculated at the points chosen in step 4. Two example wavefronts are shown 406 & 407 with the intersection lines with the design surface and wavefronts 406, 407.

The distance between the two wavefronts 406 and 407 at the secondary wall 49 is less than the distance at the symmetry plane 401. This is a result of lower wave speed near the wall 49 which requires deformations with greater height near the wall.

Figure 4B:
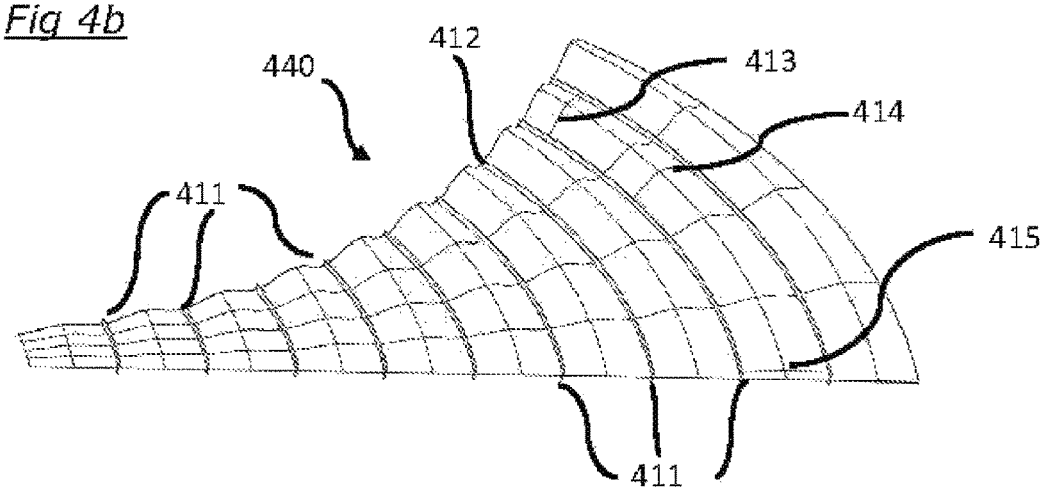

FIG. 4*b* shows the deformed design surface 416 according to the example step 6 for the geometry in FIG. 4*a*. Intersection curves for wavefronts are shown for all of the low frequency wavefronts 411. The wavefronts were derived as described in step 5a. Deformations forming wave-like corrugations running along the wavefronts are formed by a series radii constrained to have the same perimeter length along the corrugation. For example, the corrugation 412 has the same perimeter length along paths 413, 414, 415. The crests are tallest where the low frequency wavefronts are closest and wave speed lowest.

Figure 4C:
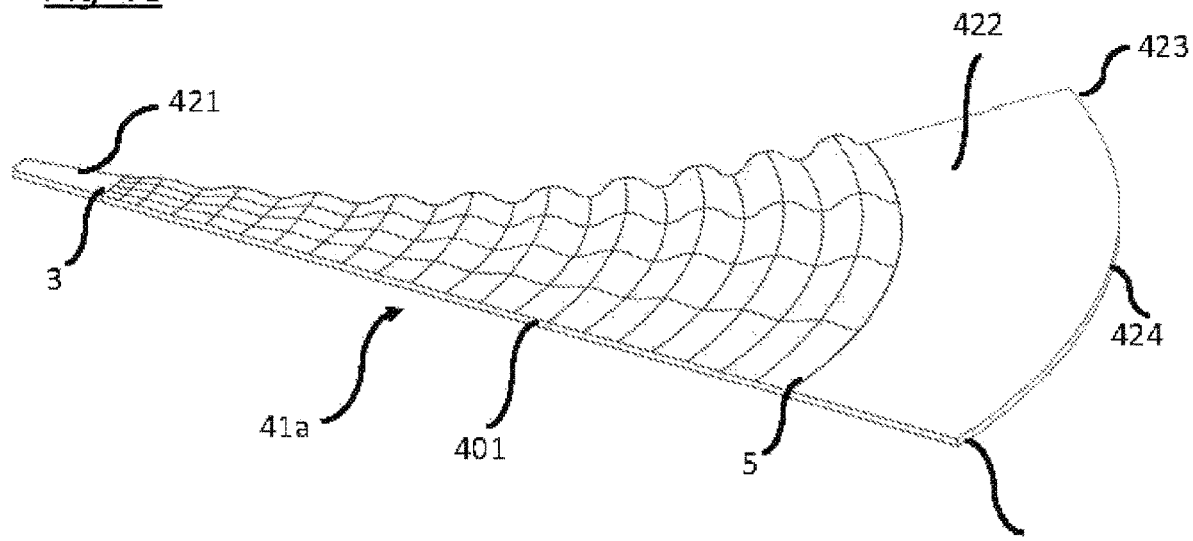
FIG. 4c is a schematic view of the waveguide formed from the design surface of FIG. 4b.

FIG. 4*c* shows the wave-shaping waveguide 41*a* formed by step 7 of the example design process on the design surface in FIG. 4*b*. The design surface 440 in FIG. 4*b* is symmetrically offset by +/−2.5 mm. A complete waveguide geometry may then be formed by adding the geometry reflected in the symmetry plane 401. A cylindrical wave is provided at the inlet aperture 3 by a prismatic input waveguide 421 and the output aperture leads to a prismatic output waveguide 422 with a wall tangential to the secondary wall formed from an exponential shaped curve of FIG. 4*a* defining the wave-shaping waveguide 41*a*. Up to the frequency where a wavelength is double the thickness of the waveguide (the vertical dimension in the drawing) the pressure across the outlet aperture 5 has minimal pressure variation. Numerical simulation shows pressure at points 423, 424, 425 at the output aperture are within 1 dB up to 20 kHz. When provided with a source generating wavefront matching the inlet aperture geometry and terminated in a matching manner the waveguide allows the wave to behave as a single parameter wave throughout the waveguide to a very close approximation.

Figure 4D:
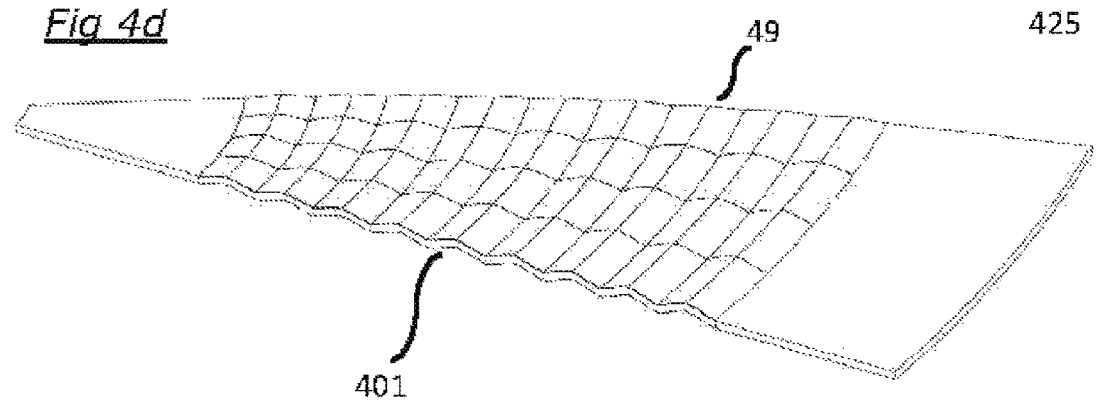
FIG. 4d shows part of a waveguide designed in accordance with the invention.

FIG. 4*d* shows half of a wave-shaping waveguide design according to the example method with symmetry plane 401. The secondary wall 49 has a smooth profile and is tangential to the walls of the inlet and outlet waveguides. The inlet and outlet waveguides are prismatic, the inner with an angle of 60 degrees, the outer with the smaller angle of 30 degrees. This results in a lower low frequency wave speed on axis resulting in deeper corrugations along the symmetry plane 401. Curved wavefronts were deduced using example method step 6a at points spaced 33 mm apart. The corrugations section shape is sawtooth with corners blended with 5 mm radii. Although the thickness in the conceptual geometry is constant in the illustrated example an overall exponential or other flare law may be achieved by adjusting the offsetting distance so the wavefront area changes according to the desired law. Numerical simulations showed that while the conceptual waveguide design has sound pressure response irregularities of several dB in the upper part of the frequency range the wave-shaping waveguide according to the invention has variations less than one dB.

Figure 5:
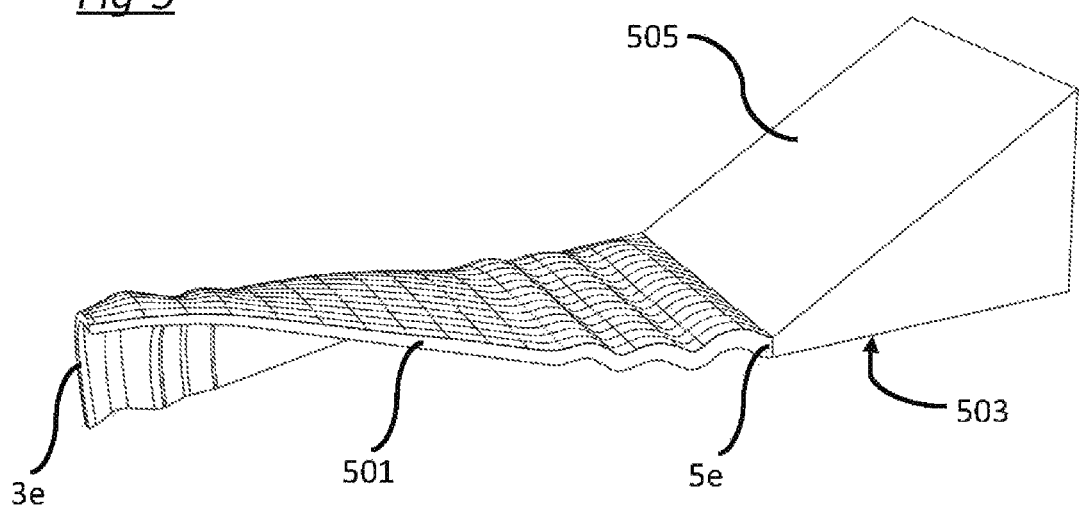
FIG. 5 is a schematic view of another embodiment of part of a waveguide in accordance with the invention.

FIG. 5 shows a quarter of a wave-shaping waveguide designed according to the example method with two perpendicular planes of symmetry 501, 503 intersecting with the rotational axis of the inlet aperture 3*e*. Both inlet and outlet apertures are planar with a prism shaped waveguide 505 terminating the outlet aperture 5*e*. The apertures 3*e*, 5*e* have differing profiles with an annular inlet aperture and a rectangular outlet aperture of larger area respectively. In this example the wavefront shape does not change although its profile and area both change.

A design surface (not illustrated) was chosen to minimise path length variation, and width variation, between the midway line across each aperture. Numerical methods were used to calculate wavefronts at 100 Hz, 1/10th of the lower working bandwidth limit of 1000 Hz. The wavefronts were calculated at 0.1 degree phase increments and used as explained in example design procedure step 6b to add corrugation type deformations to the primary surfaces. In this case only the beginning and end of the waveguide required correction to give the desired increase in wave speed. In this case a waveguide according to the invention was numerically solved and the wavefront surfaces extracted and extended to use as a geometry to create a waveguide according to the invention in which the wavefront expands exponentially.

Figure 6:
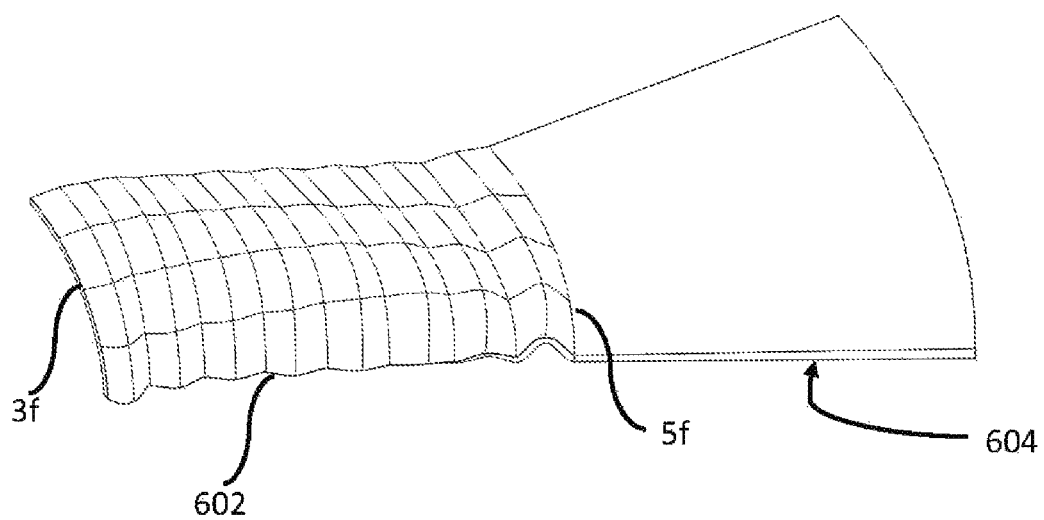
FIG. 6 is a schematic view of a further embodiment of part of a waveguide in accordance with the invention

FIG. 6 shows one quarter of a wave-shaping waveguide with two orthogonal planes of symmetry 602 and 604 designed according to the example method. The planes of symmetry are orthogonal and their intersection is co-linear with the axis of rotation of the inlet annulus 3f. The wave-shaping waveguide has a planar annular inlet aperture 3f and a cylindrical rectangular profile outlet aperture 5f to adapt the profile and shape of the waves. Both inlet and outlet apertures 3f, 5f have equal area. A design surface is formed to minimise path length variation and maintain the width to one quarter of the inlet aperture circumference. The corrugation type deformations were added using surfaces defined by calculated wavefronts for 100 Hz with 0.1 degree phase increments.

Figure 7:
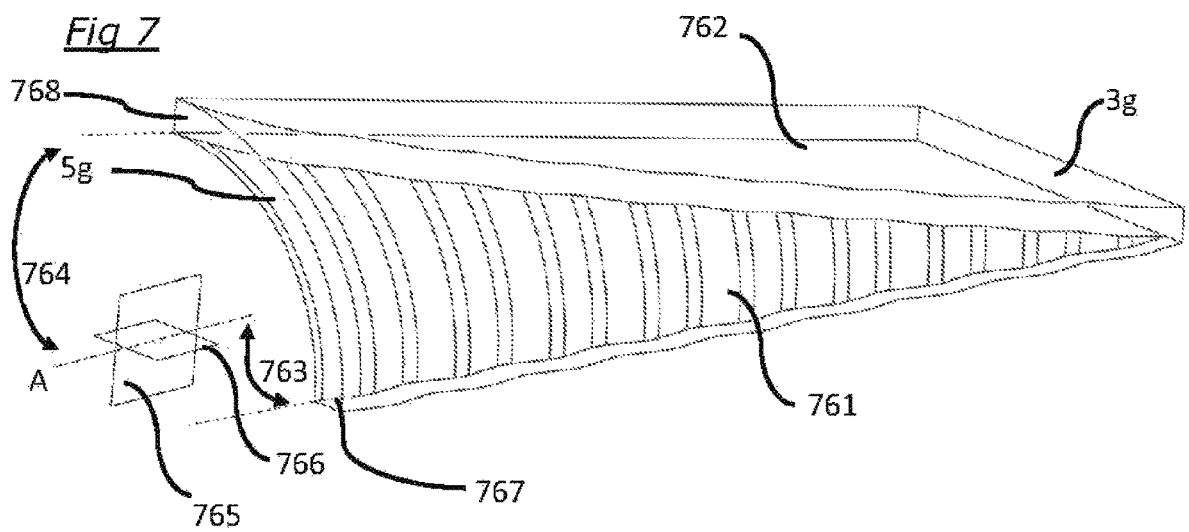
FIG. 7 is a schematic view of yet another embodiment of part of a waveguide in accordance with the invention.

FIG. 7 Shows a waveguide according to the invention designed with a conceptual waveguide formed from obliquely joined annular conical waveguide 761 and planar waveguide 762. The geometry appears similar to the VDOSC but the width of the outlet aperture 5g matches one quarter of the circumference of the annular inlet aperture 3g to avoid the wave elongation in the planar section 762. This leads to the conical section and plane section having different angles 763, 764 relative to the central axis A and different pathlengths. The two planes of symmetry are 765 and 766.

Since the wavefront width remains constant in the planar section 762, as in a duct, plane wave propagation may be assumed and the design method applied resulting in corrugation type deformations on the less steeply angled conical section 763. The wave travelling within the conical section will exhibit wavefront elongation since the circumference of the annular channel increases as the wave propagates. This may be compensated for by reducing the spacing between the conical corrugated primary surfaces at the inlet and outlet 767, 768. This waveguide has a response with only a fraction of a dB variation across the width compared to 3 dB for the prior art. The reduced variation of pressure across the waveguide output aperture is especially important for arrays of this type of waveguide where a coherent wave is required to give the expected behaviour.

Figure 8:
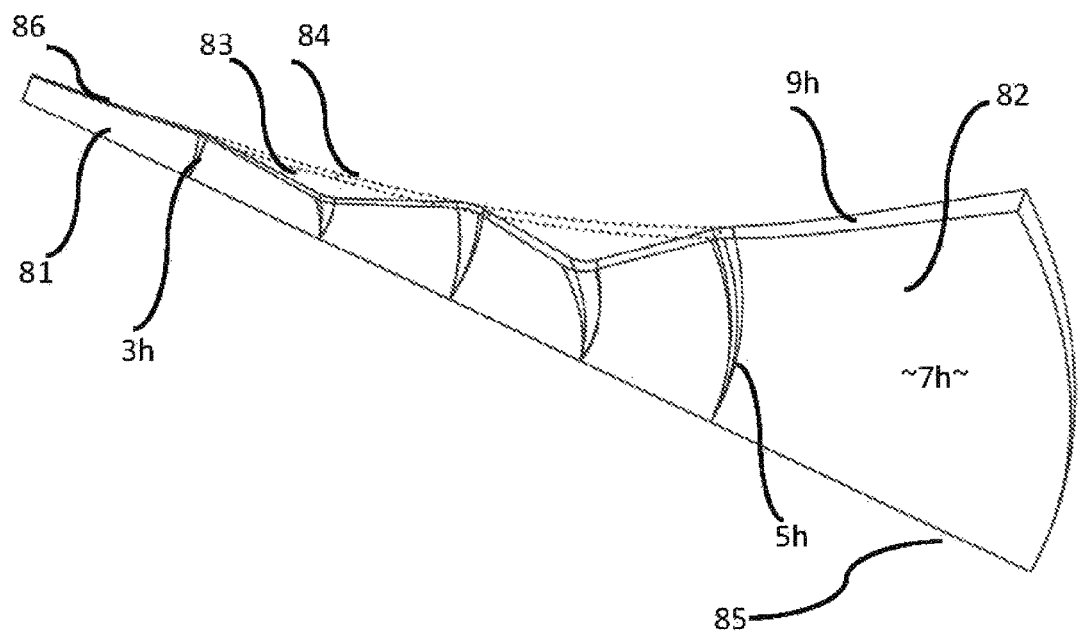
FIG. 8 is a view of one more embodiment of part of a waveguide in accordance with the invention.

FIG. 8 shows a wave-shaping waveguide, according to the invention joined to an input waveguide 81 and output waveguide 82. The conceptual waveguide for the wave-shaping waveguide was a four degree segment of a rotated body shown by the dotted lines 83 & 84. The input and output waveguides are also four degree segments of a body of rotation the other secondary boundary being formed by this the symmetry axis. The wave-shaping waveguide has primary sides 7h which intersect on the axis of rotation 85 with one secondary side 9h.

In this example the input waveguide is not an exact single parameter waveguide, since wall 186 is curved, however, it is approximately conical and wavefront errors are smaller than quarter of a wavelength at the maximum frequency with amplitude shading of only a fraction of a dB.

Where the conceptual waveguide is axisymmetric, the primary surfaces are not parallel and, although the low frequency wave speed can be satisfactorily corrected, the flare cannot be made constant since the wavefront area increases with radial distance from the axis due to the variation of spacing of the primary walls. This leads to amplitude shading which may be tolerable or even desirable for some applications.

Figure 9:
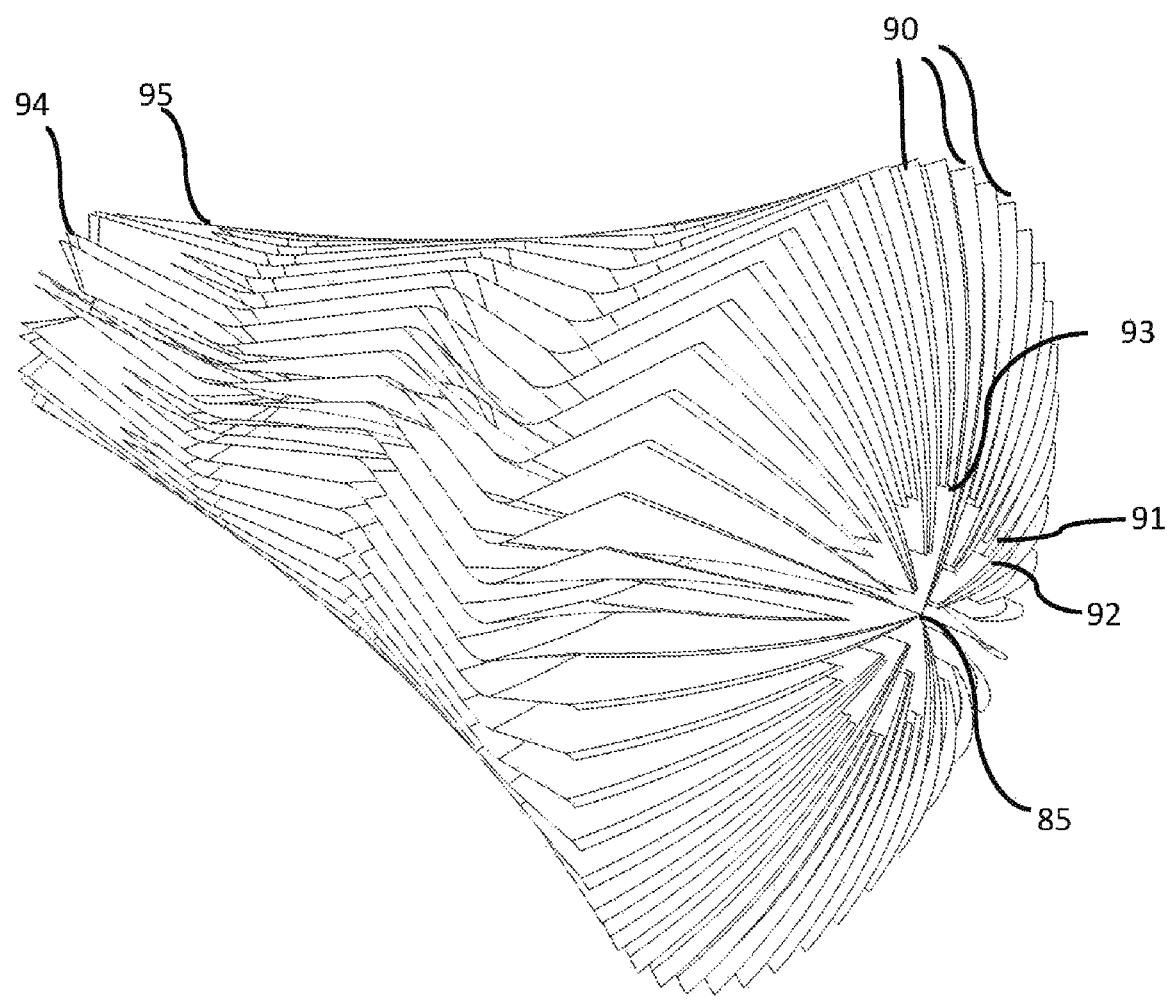
FIG. 9 is a schematic view of an array of waveguides in accordance with the invention forming a compound waveguide.

FIG. 9 shows an array of plates 90 forming primary walls for a number of waveguides between the plates. Secondary walls, as shown in FIG. 8, form a surface enclosing the plates 90. This surface is produced by rotating curve 84 in FIG. 8 around axis 85

The shallow corrugations have allowed the wave-shaping waveguide in this example to be defined with identical primary surfaces lending themselves to the use of formed sheets of material to manufacture the array walls. In some cases it may be advantageous to combine solid walls with sheet walls.

Since the spacing between the plates decreases both near the axis 85 and the inlet aperture the primary surfaces are trimmed to a number of different diameters 91, 92, 93 and different lengths 94, 95 to reduce effects due to the thickness of walls formed from the primary surfaces and tolerance problems with very small gaps between these walls. This has the result that the waveguides are combined in regions where the distance between primary surfaces are less than a quarter wavelength apart. This simplification of the design is chosen since the propagation of the wave will be unaltered due to symmetry.

Figure 10:
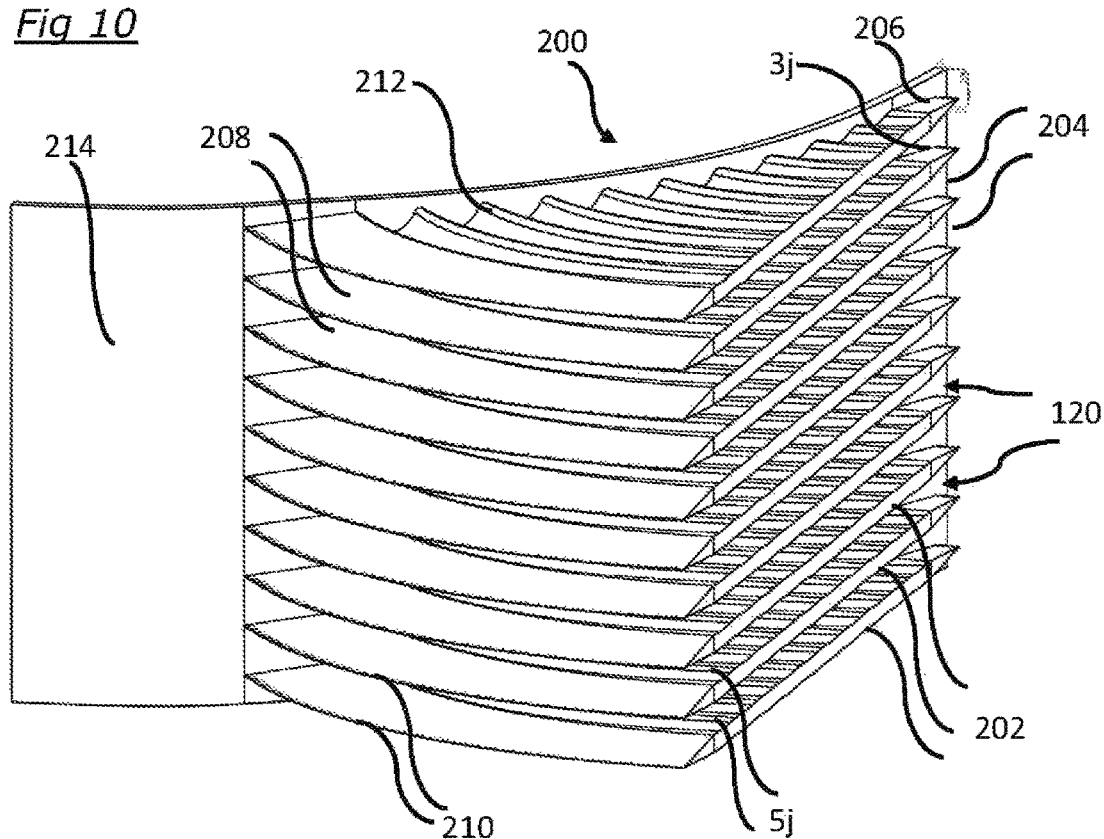
FIG. 10 is a schematic view of an array of waveguides of the type shown in FIG. 4c forming a compound waveguide.

FIG. 10 shows half of a linear array 200 in which there is a plurality of flat elements 202. Adjacent elements 202 define between them a wave-shaping waveguide 120 as shown in FIG. 4c; thus, the array 200 comprises an array of adjacent waveguides 120, sectioned along a symmetry plane as illustrated in FIG. 4c. In use a plane wave is input to the apertures 204 on the inlet side of the array, and tapered sections 206 split the input wave of the wave into segments at the wave-shaping waveguide inlets 3j before they enter the wave-shaping waveguides 120. After passing through the waveguides 120 the wave leaves through output apertures 5j entering tapered sections 208 recombines the sections into a large cylindrical wave at the cylindrical surface defined by the outer edges 210 of the flat elements 202. The deep corrugations 212 near the array output aperture 205 result in waveguide primary surfaces with differing geometry, so the members 202 have varying thickness and are preferably solid rather than hollow. The walls 214 of the outer section of the array are shaped to reduce diffraction fringing.

Figure 11:
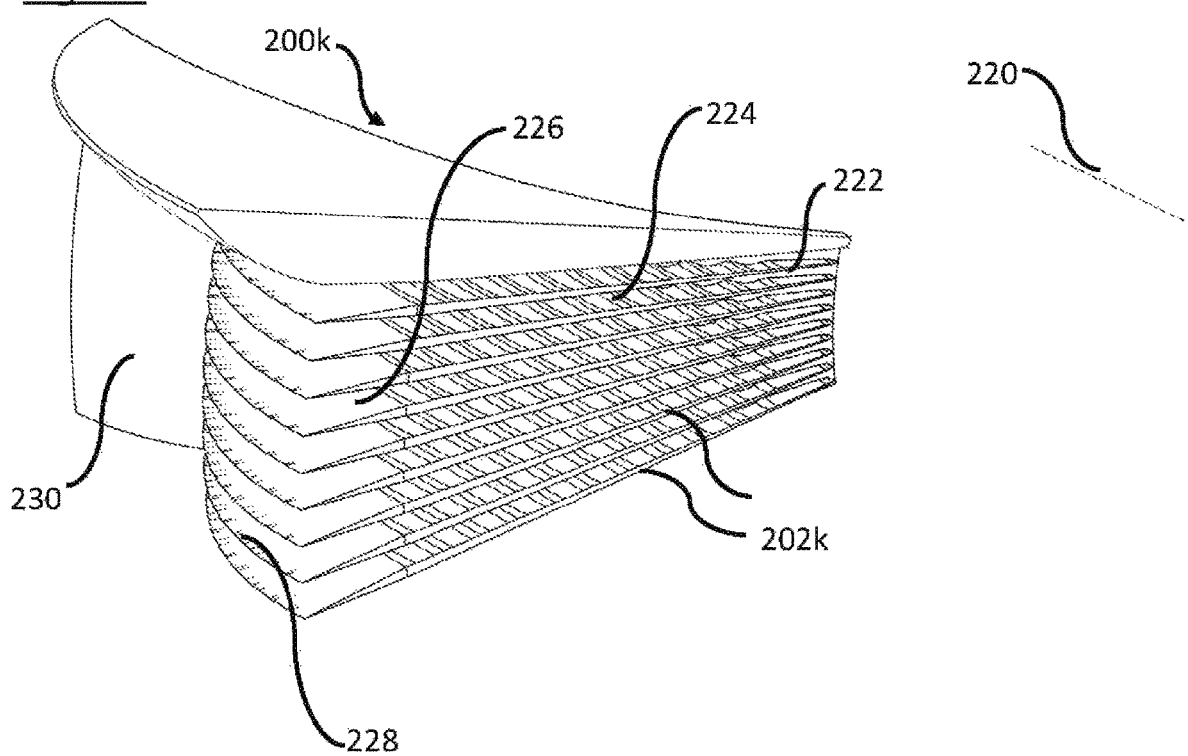
FIG. 11 is a schematic view of an array of waveguides of the type shown in FIG. 4c forming another compound waveguide.

FIG. 11 shows half of an array 200k of wave-shaping waveguides similar to the array 200 in FIG. 10 but with the individual elements 202k defining the waveguides arranged in a rotational array about the axis 220, with a symmetry plane as before. In use an acoustic wave passes through the first waveguide section 222 which divides the wave into the individual waveguides, then propagates along the second waveguide section 224, which is the wave-shaping part of the waveguide, then through the third section 226 which recombines the waves into a toroidal wavefront at 228, the surface formed at the outer edges of the elements forming the waveguides. The walls of the final, fourth section 230 are shaped to reduce diffraction fringing.

The first and third sections 222, 226 allow the wave to expand or contract normal to the planes of the elements 202k following on from the primary walls with walls shaped to provide the desired area expansion.

Figure 12:
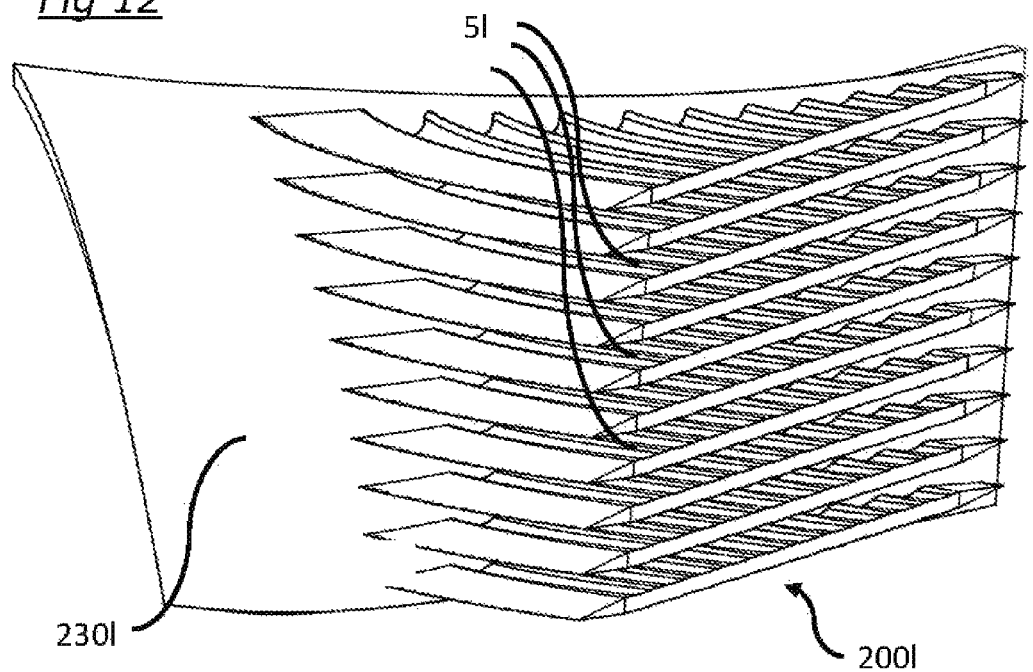
FIG. 12 shows another array of waveguides of the type shown in FIG. 4c forming a further compound waveguide.

FIG. 12 illustrates an array 200*l* of wave-shaping waveguides similar to those of FIGS. 10 and 11, but here the walls of the final, fourth section 230*l* waveguides are curved in a second dimension so as to provide varying dispersion angles at the output apertures 5*l*. Such an arrangement of dissimilar wave-shaping waveguides can produce an incremental change in wavefront shape and amplitude shading. In this case the amplitude shading is provided by the angle variation—the upper wave-shaping waveguides have a wider dispersion resulting in lower sound pressure level than the lower waveguides.

It is also possible (but not illustrated) to vary the inlet aperture height of arrays such as those of FIG. 10, 11 or 12 to adjust the input energy. For example decreasing the inlet aperture but not the output aperture will decrease the output pressure. This provides the opportunity to design wave-shaping arrays to provide a wavefront with tailored shape, profile and amplitude shading to give even coverage of a specific area. In this case is it most likely that the wave-shaping elements would be produced by means of 3D printing.

It will of course be understood that many variations may be made to the above-described embodiment without departing from the scope of the present invention. For example, the inventive waveguide has been defined in relation to a high frequency wave, and high frequency has been defined as being towards the upper end of the audible spectrum; it will be understood that in certain applications a waveguide may be designed which is intended for a range of acoustic frequencies which terminate significantly below the audible high frequency limit (of about 20 kHz; for example, a waveguide may be intended to convey acoustic frequencies between 100 to 100 Hz, in which case the waveguide is designed in relation to the wavelength of the highest frequency which the waveguide is intended to convey). Examples are given in which there are a plurality of corrugations along the waveguide, but it should be understood that a compound waveguide could comprise a series of sections, each having only a single corrugation, with a straight waveguide section between corrugated sections.

The present invention has been described herein with reference to acoustic apparatus; however, it will be appreciated that the principles described above are equally applicable to electromagnetic waves, particularly those of microwave wavelength, and the present invention therefore extends to methods and waveguide apparatus intended for use with such waves.

Where different variations or alternative arrangements are described above, it should be understood that embodiments of the invention may incorporate such variations and/or alternatives in any suitable combination.

The invention claimed is:

1. A method of designing a waveguide for conveying acoustic waves along a wave propagation path through the waveguide from a waveguide inlet to a waveguide outlet, the waveguide providing a boundary confining the acoustic waves as they travel along the wave propagation path and being configured to restrict the size of the waves in one dimension to a distance less than a wavelength of a high frequency acoustic wave, the method comprising the steps of:
(1) defining the shape of the boundary at the waveguide inlet and at the waveguide outlet, and defining the distance between and the relative orientation of the waveguide inlet and the waveguide outlet according to a predetermined flare and waveguide input impedance;
(2) defining a conceptual waveguide shape to join the waveguide inlet to the waveguide outlet such that any variation in boundary shape and/or in direction of the waveguide propagation path are progressive along the waveguide propagation path;
(3) deriving from the conceptual shape of the waveguide a theoretical design surface extending along the waveguide propagation path and dividing the waveguide in a direction parallel to the said one dimension;
(4) defining a series of three or more spaced points along a wave propagation path through the waveguide;
(5) deriving homogeneous wavefront surfaces and their shapes within the waveguide at each of the series of points;
(6) deforming the shape of the design surface between each successive pair of spaced points normal to the design surface by a distance such that the propagation distance between the derived wavefront surfaces at the two spaced points is substantially constant;
(7) adjusting the conceptual waveguide shape in a direction parallel to the said one dimension by offsetting the deformed design surface by the said distance less than a wavelength at the spaced points, and
(8) calculating the flare of the derived wavefront surfaces at each of the spaced points and adjusting the local boundary dimension in a direction parallel to the said one dimension such that the flare for successive derived wavefront surfaces is appropriate for a predetermined acoustic load, and either
(i) the flare of the derived wavefront surfaces is constant across the whole of the derived wavefront surface, or
(ii) the flare varies smoothly and gradually across the derived wavefront surface.

2. The method according to claim 1 in which the shape of the boundary at the waveguide inlet and at the waveguide outlet is defined by reference to the desired wave shape.

3. The method according to claim 1 for a waveguide having primary surfaces to restrict expansion of the waves in the said one dimension and secondary surfaces to restrict expansion of the waves in a second dimension, in which the method comprises deriving the shapes of the homogeneous wavefront surfaces at each of the series of points by assuming:
i. that each wavefront has a constant flare, and
ii. that each wavefront is perpendicular where it contacts the primary and secondary surfaces as the wavefront travels along the propagation path.

4. The method according to claim 1 for a waveguide having primary surfaces to restrict expansion of the waves in the said one dimension and secondary surfaces to restrict expansion of the waves in a second dimension, in which the method comprises calculating the shapes of the homogeneous wavefront surfaces at each of the series of points by at a frequency low enough for the wavelength to be at least one and preferably two orders of magnitude greater than the distance between the primary surfaces.

5. The method according to claim 1 in which the shapes of the homogeneous wavefront surfaces at each of the series of points are derived by solving Laplace's equation and finding homogeneous surfaces of constant value for the solved parameter through the series of points.

6. The method according to claim 1 further comprising the iteration of steps (7) and (8) so as further to offset the deformed design surface.

7. The method according to claim 1 comprising iterating one or more of the steps so as to minimise variations in the transfer function at the waveguide outlet.

8. A waveguide for conveying acoustic waves along a wave propagation path through the waveguide from a waveguide inlet to a waveguide outlet, the waveguide providing a boundary confining the acoustic waves as they travel along the wave propagation path and having two substantially parallel, primary surfaces spaced apart a distance less than a wavelength of a high frequency acoustic wave, the waveguide being designed in accordance with a method of designing the waveguide for conveying the acoustic waves along the wave propagation path through the waveguide from the waveguide inlet to the waveguide outlet, the waveguide providing the boundary confining the acoustic waves as they travel along the wave propagation path and being configured to restrict the size of the waves in one dimension to a distance less than the wavelength of a high frequency acoustic wave, the method comprising the steps of:
  (1) defining the shape of the boundary at the waveguide inlet and at the waveguide outlet, and defining the distance between and a relative orientation of the waveguide inlet and the waveguide outlet according to a predetermined flare and waveguide input impedance;
  (2) defining a conceptual waveguide shape to join the waveguide inlet to the waveguide outlet such that any variation in boundary shape and/or in direction of the waveguide propagation path are progressive along the waveguide propagation path;
  (3) deriving from a conceptual shape of the waveguide a theoretical design surface extending along the waveguide propagation path and dividing the waveguide in a direction parallel to the said one dimension;
  (4) defining a series of three or more spaced points along the wave propagation path through the waveguide;
  (5) deriving homogeneous wavefront surfaces and their shapes within the waveguide at each of the series of points;
  (6) deforming a shape of the design surface between each successive pair of spaced points normal to the design surface by a distance such that the propagation distance between the derived wavefront surfaces at the two spaced points is substantially constant;
  (7) adjusting the conceptual waveguide shape in a direction parallel to the said one dimension by offsetting a deformed design surface by a distance less than a wavelength at the spaced points, and
  (8) calculating a flare of the derived wavefront surfaces at each of the spaced points and adjusting the local boundary dimension in a direction parallel to the one dimension such that the flare for successive derived wavefront surfaces is appropriate for a predetermined acoustic load, and either
    (i) the flare of the derived wavefront surfaces is constant across the whole of the derived wavefront surface, or
    (ii) the flare varies smoothly and gradually across the derived wavefront surface.

9. The waveguide according to claim 8 in which the shape of the boundary varies progressively along the path.

10. The waveguide according to claim 8 in which the boundary is offset in a direction perpendicular to the primary surfaces to form one or more localised deformations in the propagation path.

11. The waveguide according to claim 10 in which the extent of the offset varies in a direction parallel to the primary surfaces.

12. The waveguide according to claim 8 in which the distance between the primary surfaces is substantially constant.

13. The waveguide according to claim 8 in which the primary surfaces are substantially planar.

14. The waveguide according claim 8 in which the shape of the boundary at the inlet and outlet is different.

15. The waveguide according to claim 8 in which the cross-sectional area of the boundary at the initial and subsequent points is different.

* * * * *